US008362480B1

(12) United States Patent
Hess et al.

(10) Patent No.: US 8,362,480 B1
(45) Date of Patent: Jan. 29, 2013

(54) REUSABLE TEST CHIP FOR INLINE PROBING OF THREE DIMENSIONALLY ARRANGED EXPERIMENTS

(75) Inventors: Christopher Hess, San Carlos, CA (US); John Kibarian, Los Altos Hills, CA (US); Amit Joag, Sunnyvale, CA (US); Abdul Mobeen Mohammed, Santa Clara, CA (US); Ben Shieh, Sunnyvale, CA (US); David Stashower, San Jose, CA (US)

(73) Assignee: PDF Solutions, Inc., San Jose, CA (US)

( * ) Notice: Subject to any disclaimer, the term of this patent is extended or adjusted under 35 U.S.C. 154(b) by 451 days.

(21) Appl. No.: 11/903,943

(22) Filed: Sep. 25, 2007

(51) Int. Cl.
*H01L 29/10* (2006.01)

(52) U.S. Cl. .......... 257/48; 257/E23.179; 257/E21.521; 257/E21.524

(58) Field of Classification Search .................. 257/48, 257/E23.179, E21.521, E21.524; 438/14, 438/17, 18
See application file for complete search history.

(56) References Cited

U.S. PATENT DOCUMENTS

| | | | | |
|---|---|---|---|---|
| 6,423,558 | B1 * | 7/2002 | Maeda et al. | 438/17 |
| 7,061,263 | B1 * | 6/2006 | Ong | 324/765 |
| 7,064,450 | B1 * | 6/2006 | Eghan et al. | 257/786 |
| 7,388,394 | B1 * | 6/2008 | Primavera et al. | 324/765 |
| 2004/0178787 | A1 * | 9/2004 | Liu | 324/158.1 |
| 2006/0105475 | A1 * | 5/2006 | Ciplickas et al. | 438/14 |
| 2007/0109003 | A1 * | 5/2007 | Shi et al. | 324/755 |
| 2009/0057664 | A1 * | 3/2009 | Lim et al. | 257/48 |

OTHER PUBLICATIONS

Christopher Hess, Anand Inani, Yun Lin, Michele Squicciarini, Ron Lindley, Nobuchika Akiya, Scribe Characterization Vehicle Test Chip for Ultra Fast Product Wafer Yield Monitoring, IEEE 2006 Int. Conference on Microelectronic Test Structures, pp. 110-115, Mar. 2006.
Hess, C., Weiland, L. H., Defect Parameter Extraction in Backend Process Steps using a Multilayer Checkerboard Test Structure, Proc. International Conference on Microelectronic Test Structures (ICMTS), pp. 51-56, Nara (Japan), 1995.
Hess, C., Weiland, L. H., Harp Test Structure to Electrically Determine Size Distributions of Killer Defects, IEEE Transactions on Semiconductor Manufacturing, pp. 194-203, vol. 11, No. 2, 1998.
Christopher Hess, Larg H. Weiland, Strategy to Disentangle Multiple Faults to Identify Random Defects within Test Structures, Proc. International Conference on Microelectronic Test Structures (ICMTS), pp. 141-146, Kanazawa (Japan), 1998.
Christopher Hess, Larg H. Weiland, Defect Parameter Extraction in Backend Process Steps using a Multilayer Checkerboard Test Structure, Proc. International Conference on Microelectronic Test Structures (ICMTS), pp. 51-56, Nara (Japan), 1995.
Christopher Hess, Larg H. Weiland, Harp Test Structure to Electrically Determine Size Distributions of Killer Defects, IEEE Transactions on Semiconductor Manufacturing, pp. 194-203, vol. 11, No. 2, 1998.
Christopher Hess, Anand Inani, Yun Lin, Michele Squicciarini, Ron Lindley, Nobuchika Akiya, Scribe Characterization Vehicle Test Chip for Ultra Fast Product Wafer Yield Monitoring, IEEE 2006 Int. Conference on Microelectronic Test Structures, pp. 110-115, Mar. 2006.

* cited by examiner

*Primary Examiner* — Tucker Wright
(74) *Attorney, Agent, or Firm* — David Garrod

(57) ABSTRACT

A Characterization Vehicle (CV) and a method for forming it which yields a gain in efficiency for IC yield ramp improvements by enabling faster learning cycles and diagnosis while reducing costs. A plurality of SF experiments are combined into a single full flow mask set with many inline testing points. Smaller pads are arranged in a way supporting testing of interleaved pad frames, parallel testing, and the usage of stacked test structures, or Devices Under Test (DUT's).

9 Claims, 14 Drawing Sheets

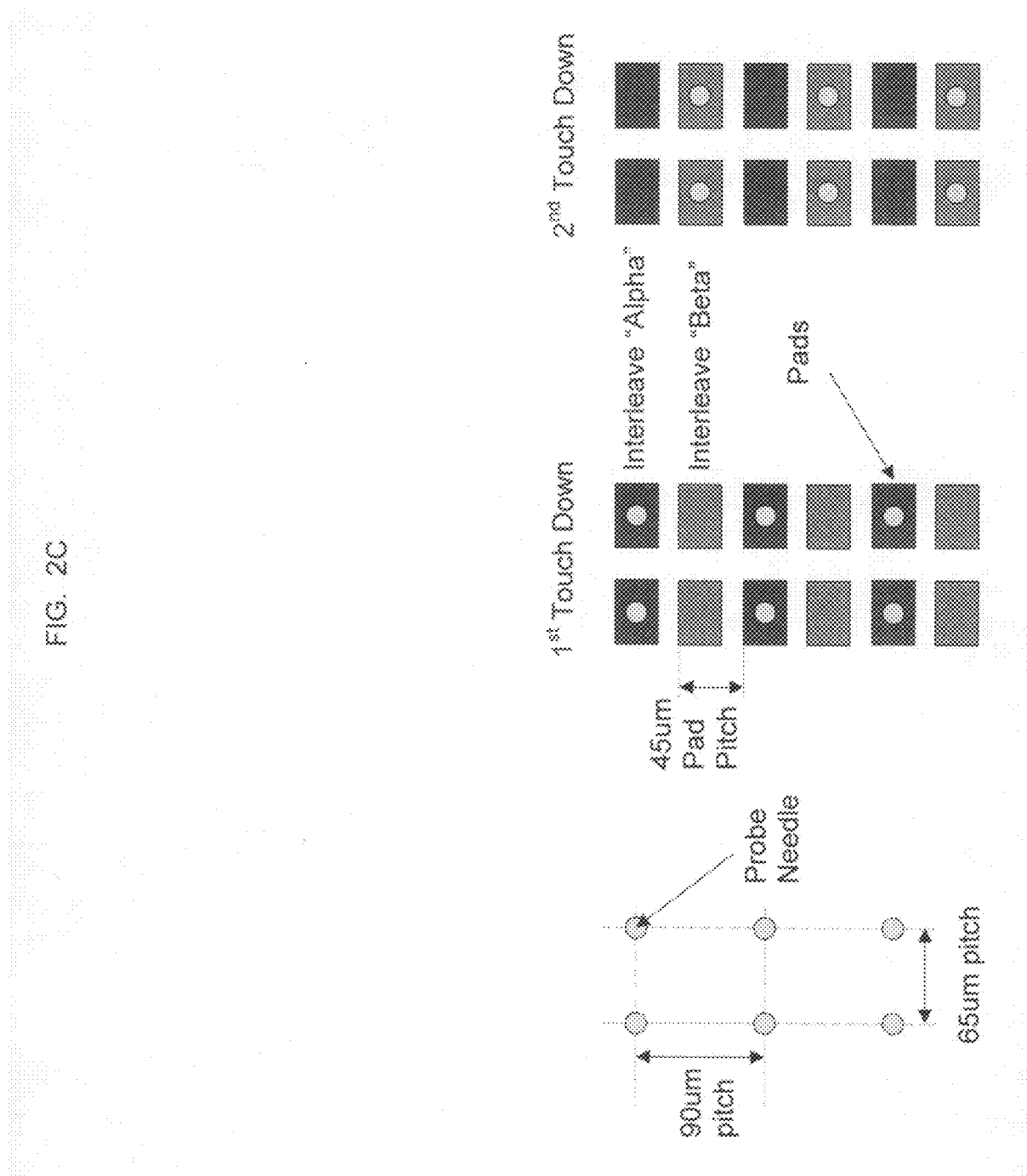

REUSABLE TEST CHIP FOR INLINE PROBING OF THREE DIMENSIONALLY ARRANGED EXPERIMENTS

FIELD OF THE INVENTION

This invention relates to the fabrication of integrated circuits, and more specifically to methods and systems used in the improvement of integrated circuit product yield and performance.

BACKGROUND OF THE INVENTION

With the increasingly rapid change in integrated circuit fabrication processes and market conditions, the relationship between the yield and performance ramp and profitability is also undergoing rapid change. Typical yield vs. time and price vs. time graphs are shown in FIG. 1. Typical yield starts at an initial value $Y_{initial}$, and can eventually achieve a final value $Y_{final}$ when the process matures and production maximizes. Between the initial and final values is the yield ramp region 100, where yield is increasing at a yield ramp rate. This period also typically shows a lowering of the price at a price slope rate. Traditionally, yield improvement efforts focused mainly on reduction in defects, which would have a large impact on final yield. However, with the current situation of increasing complexity of processes coupled with shorter product lifetimes of integrated circuit products, there is generally minimal production at final yield, therefore final yield is a smaller factor in IC profitability. Improvements in initial yield (highly dependent on design) and yield ramp rate are far more important.

To this end, a critical factor in improving yield ramp rate is the gathering and statistical analysis of large amounts of experimental yield-relevant data within a short time span.

In recent years, a primary source of yield-relevant data is obtained via specially designed Test Chips, also called Characterization Vehicles (CV's). The CV's contain features which match one or more attributes of the proposed product layout, and are designed to support yield models which can be used for accurate yield prediction. These CV's, fabricated using a mask set and implementing all or a portion of the process used for the IC in question, comprise test structures which can be used to perform experiments that provide yield-relevant data. Examples include: snakes and combs for continuity/bridging, open via tests. Basic test structures are described in Buehler, M. G., *Microelectronic Test Chips for VLSI Electronics, VLSI Electronics Microstructure Science*, pp 529-576, Vol. 9, Chapter 9, Academic Press, 1983.

Due to the increasing density and complexity of IC structures and processes, including multiple layers of conducting interconnections, insulating layers, and connecting vias, as well as active devices, poly, and contacts, more and more test structures must be designed, manufactured, tested, and analyzed to enable a high quality Yield Impact Evaluation. More than 1,000 experiments may be required simply to characterize the Front End Of Line (FEOL), including Active Area (AA), Poly, and Contact. The FEOL CV's require more area for leakage and SRAM evaluation. Additional experiments are required to characterize up to 10 Back End Of Line (BEOL) metal and via layers.

In the current short time frames necessary for gathering information to enhance yield, fast feedback loops to accelerate yield learning, as well as fast test time, are critical. Data must be quickly provided in order to decide on process and layout changes to improve product yield. This requires the use of Short Flow's (SF's) whenever possible.

Short Flows are described in U.S. Pat. No. 6,834,375 by Stine et al, issued Dec. 21, 2004. A Short Flow is defined as encompassing only a specific subset of the total number of process steps in the integrated circuit fabrication cycle. Many Short Flow CV's in the art (an example of which is described in Hess, C., Stashower, D., Stine, B. E., Weiland, L. H., Verma, G., Miyamoto, K., Inoue, K., *Fast Extraction of Defect Size Distribution Using a Single Layer Short Flow NEST Structure*, IEEE Transactions on Semiconductor Manufacturing, pp. 330-337, Vol. 14, No. 4, 2001), characterize only one aspect of the IC. For example, while the total fabrication cycle might contain up to 450 or more process steps, a CV such as one designed to investigate manufacturability of a single interconnection layer would only need to include a small number, e.g., 10-25 process steps, since active devices and multiple interconnection layers are not required to obtain a yield model or allow accurate diagnosis of the maladies afflicting these steps associated with a single interconnection layer in the process flow.

The use of large numbers of short flow CV's, each on dedicated wafers, is inefficient, problematic, and expensive. Wafers, reticles, and masks for mask sets are quite costly. As will be illustrated later, the presence of large numbers of SF lots in the fabrication facility causes crowding and loading of the fab with engineering lots, particularly at the Front End Of Line (FEOL). It is important to reduce the number of mask layers processed, as well as reducing the number of engineering wafers processed.

A typical single-experiment SF characterization vehicle (wafer) has 5,000-7,500 pads. Accordingly, evaluating all the typical layers in one mask set would require 50,000-75,000 pads. Using current layout and dimensions, a die size of 27 mm×27 mm would be required for the pads only, with no test structures included. This is an unrealistic value.

A typical single-experiment SF wafer requires 5-10 hours for testing. Accordingly, evaluating all the typical layers in one full flow mask set would require 50-100 hours of testing per wafer, corresponding to about three months per lot. This is an unrealistic value, particularly given the necessity for fast feedback loop.

A potential efficiency gain could be achieved by:
a) combining experiments into one mask set; and
b) enabling parallel testing.

SUMMARY OF THE INVENTION

The present invention addresses the issues of enabling faster learning cycles and diagnosis while reducing costs. This is done by providing a CV and a method for forming it which yields a gain in efficiency for yield ramp improvements. A plurality of SF experiments are combined into a single full flow mask set with many inline testing points. Another aspect of the invention is the usage of smaller pads arranged in a way supporting testing of interleaved pad frames, parallel testing, and the usage of stacked test structures, or Devices Under Test (DUT's).

BRIEF DESCRIPTION OF THE DRAWINGS

FIG. 2c illustrates interleaved pads using the inventive smaller pad frame.

DETAILED DESCRIPTION OF THE INVENTION

Figure 1:
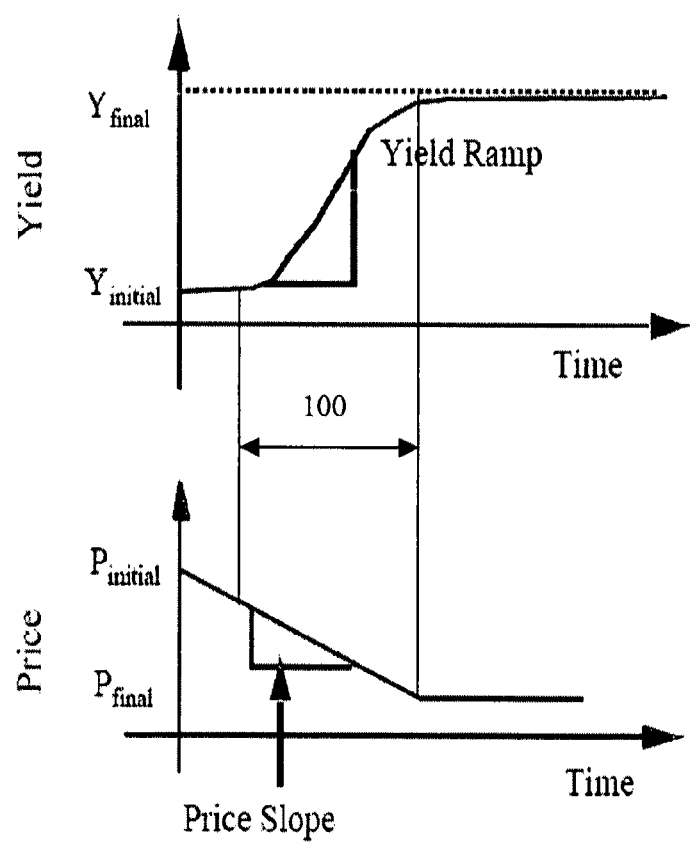
FIG. 1 shows yield vs. time and price vs. time graphs.

A preferred embodiment of the present invention provides a CV and a method for forming it which yields a gain in efficiency for yield ramp improvements by combining a plurality of SF test structures, in a stacked configuration, into a single full flow mask set with many inline testing points, and using smaller pads arranged in a way supporting testing of interleaved pad frames. The advantages to the customer are manifold: a) cost reduction of 30-50% due to fewer wafers run; b) cost reduction due to reduced number of masks; c) more fast learning loops due to the smaller number of CV's in production. However, there are several challenges inherent in designing and implementing such a CV.

The present invention addresses these challenges with several CV design and method innovations. These include a vehicle and method to better utilize mask and wafer area, and a vehicle and method to decrease manufacturing and test time so as to accelerate yield learning.

An aspect of the present invention is an advanced test chip (CV) design using only passive elements for the detection of open circuits and short circuits.

Typically, the vast majority of the structures on SF's look for open and short circuits as well as for marginal shifts in resistance or leakage. Examples of such typical structures are:
NEST structures used to detect open and short circuits;
contact and via chains used to detect open contacts/vias;
snake and comb structures used to detect open and short circuits;
combs to check for short circuits;
snakes for detecting open circuits. These typical structures are described in the earlier cited reference by Buehler.

A comparatively small number of structures address additional issues that require more sophisticated measurements. Examples of these include: a) Van Der Pauw (VDP), also described in the above-cited Buehler reference. This structure measures sheet resistance, and contains no active devices, just metal and contact; b) Kelvin structure (also with no active devices) for Critical Dimension (CD) determination, described in U.S. Pat. No. 6,901,564, issued May 31, 2005.

The CV of the present invention enables the group of experiments that is most frequently used and has the least complicated measurement requirements for the design and test improvements. An aspect of the inventive CV is that it preferably includes only passive structures, no active devices or transistors. This implies that there is no device based logic included. Therefore, the only types of structures included on the inventive CV are:

Snakes, combs, snake-and-combs, NEST, contact/via chains, VDP, Kelvin CD, and/or any other structures with passive elements only.

The present inventive CV is preferably a Passive CV, i.e., a CV utilizing passive elements only, but with more available pads for test structures due to smaller, interleaved pads. This allows a larger number of passive test structures on a die. Other aspects of the present CV may include the use and enablement of high efficiency parallel testing and inline probing, and a stacked design which provides test access to any layer in the last two or three routing layers only, i.e., only accessing a subset of pads at any particular point, which also increases the possible number of test structures.

A goal of the present invention is to increase the number of probing pads so as to be able to connect more test structures. An aspect of the present invention is to use smaller pads in a smaller pad frame. This provides for implementing more pads within a smaller relative chip area used for those pads, leaving more available space for test structures. Another component of increasing area for test structures is the interleaved probing of those smaller pads.

Figure 2A:
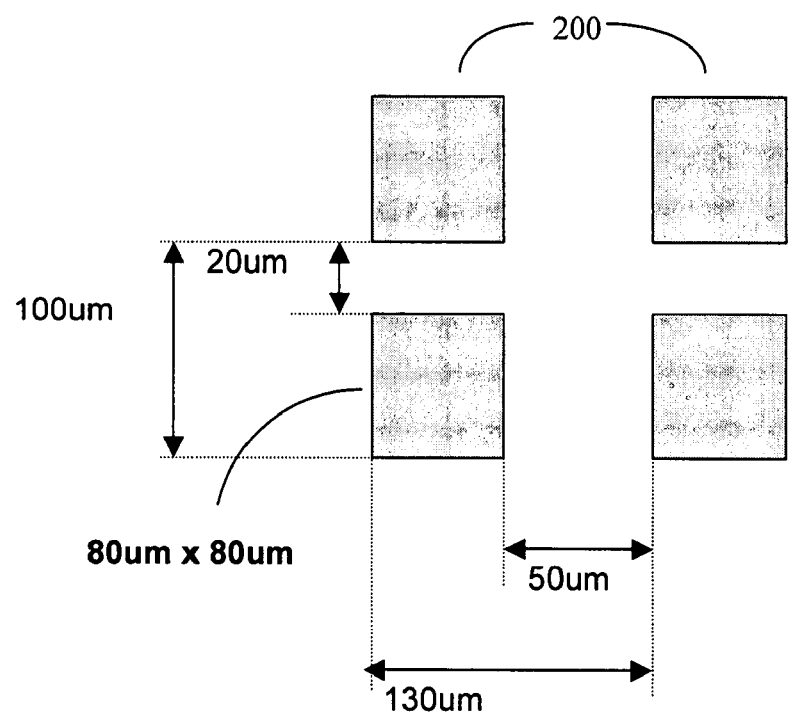
FIG. 2a illustrates the currently used standard pad frame.

FIG. 2a illustrates the currently used standard pads. A padframe using 2 by 106 80 um×80 um pads (200) with 20 um spacing in the y-direction and 50 um spacing in the x-direction yields a 100 um pitch in y and a 130 um pitch in x. The total padframe size is 210 um in x and 1580 um in y. This current frame is problematic, since: a) more experiments require more pads; b) it utilizes too much area for pads instead of using it for test structures; and c) the pads typically violate maximum layer density, especially in FEOL.

Figure 2B:
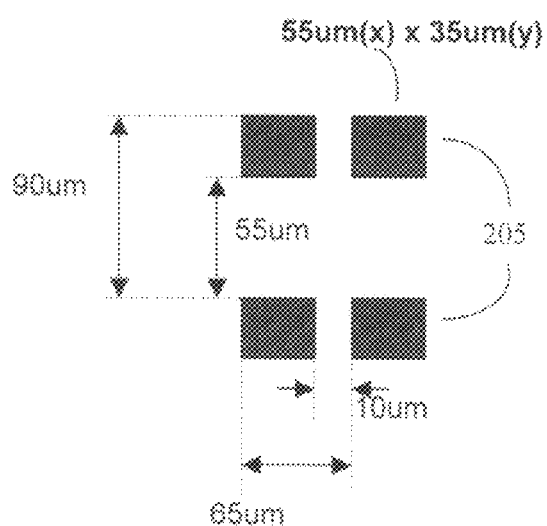
FIG. 2b illustrates the inventive smaller pad frame.

The present invention addresses these problems with a 2 by 112 pad frame, illustrated in FIG. 2b. 55 um×35 um pads (205) have a spacing of 55 um in y, 10 um in x., yielding a 90 um pitch in y and a 65 um pitch in x. The total padframe size is 120 um in x and 10025 um in y. These dimensions and layout are exemplary, and the invention is not limited to these values. These smaller dimensions provide some increase in pad density, but the greater benefit is seen by the ability to interleave pad frames in y, illustrated in FIG. 2c. The limiting factor in the density of pads is not the fabrication of the pad arrays themselves, but rather the probe card setup. The pitch of the testing probe needles is too large to permit closer pad spacing using the current frame: the typical pitch is 90 um or more for a 2 by n probe card. The inventive CV utilizes a pitch smaller than that of the probe card, while still providing access to all test structures. The smaller pad dimensions shown in FIG. 2b enable the extra y-spacing to allow the interleaving of FIG. 2c. The test structures are connected to the pads in such a way as to probe every other pad during one touch down, thus allowing for the 90 um pitch of the probe card, illustrated by points 207 on the figure, while still providing the additional interleaved pads. FIG. 2c shows a first touchdown on interleave "alpha" pads (210), and a second touchdown on interleave "beta" pads (215).

The result of the smaller pads plus the interleaving is that the inventive padframe offers twice as many pads using approximately 50% of the area. Thus, for the exemplary values described earlier, approximately 4 times the number of pads will be available on the same floor space for connecting to test structures. Accordingly, the amount of floor space used on the CV for pads can be significantly reduced, allowing significantly more available area for test structures. Prior art pad layouts yielded a typical overall efficiency (total combined area of test structures on all IC layers with respect to the overall combined chip area) of about 30%, with 40-50% of area used for pads and about 20% used for routing. With the inventive pad structure of this invention, the overall efficiency is raised to above 40%, generally 50% or greater, with pads taking about 30% or less and routing about 20%.

A benefit of the pad arrangement described above is its enabling the use of large probe cards, for example 2 by 112 probes. The use of large probe cards means that fewer touch downs are required for testing the entire CV. If the tester has sufficient testing channels to support testing all of the probes in parallel for each touch down, i.e., parallel testing, the smaller number of total touch downs per CV can provide significant reduction in test time for the CV.

The stacking of the test structures and the connection of the test structures to the interleaved pads, i.e., the pad routing, is described hereinafter.

An aspect of the present inventive CV is the use of three-dimensional stacked test structures, or DUT's. This provides a more efficient use of the available area, thereby increasing the number of possible test structures with which to perform experiments. The goal is to use the chip area in all layers for test structures. Stacked DUT's have been described in the art, but have limitations which make them sub-optimal for application to the problems addressed herein. Three-dimensional packing of test structures is described in Christopher Hess, Anand Inani, Yun Lin, Michele Squicciarini, Ron Lindley, Nobuchika Akiya, *Scribe Characterization Vehicle Test Chip for Ultra Fast Product Wafer Yield Monitoring*, IEEE 2006 *Int. Conference on Microelectronic Test Structures*, pp. 110-115, March 2006. This reference is hereby incorporated by reference in its entirety. However, active devices are used to address those test structures, which requires a much larger subset of processing steps. This will prevent the flexibility of many SF's in a single reticle set.

Other prior 3D stacked structures are known as checkerboard structures and harp test structures. These are described in:
1. Hess, C., Weiland, L. H., *Defect Parameter Extraction in Backend Process Steps using a Multilayer Checkerboard Test Structure*, Proc. International Conference on Microelectronic Test Structures (ICMTS), pp. 51-56, Nara (Japan), 1995; and
2. Hess, C., Weiland, L. H., *Harp Test Structure to Electrically Determine Size Distributions of Killer Defects*, IEEE Transactions on Semiconductor Manufacturing, pp. 194-203, Vol. 11, No. 2, 1998. Both of the above cited references are hereby incorporated by reference in their entireties.

These prior structures are problematic since they only work for determining random defects for repetitive structures that cause short circuits. Any structures looking for open circuits, such as snakes and chains, cannot be used. Furthermore, it is impossible to unambiguously map test results to failure cell locations, due to extensive pad sharing, as reported in: Hess, C., Weiland, L. H., *Strategy to Disentangle Multiple Faults to Identify Random Defects within Test Structures*, Proc. International Conference on Microelectronic Test Structures (IC-MTS), pp. 141-146, Kanazawa (Japan), 1998.

In contrast, the inventive CV is designed so that its test structures are preferably connected to individual pads with little or no pad sharing, which enables non-ambiguous results to detect short circuits as well as open circuits. Failing of one test structure does not impact the functionality of any other test structures, since they are independently connected to pads. Specifically, on the inventive CV, each non-identical test structure shares at most one probing pad.

The present inventive CV preferably utilizes a minimum of two, generally at least three stacked DUT's for passive yield experiments. For the purposes of this invention, the term "stacked DUT's" is defined as meaning sets of IC elements to be utilized to perform tests or experiments providing information which may be yield-relevant, wherein there are a plurality of such sets of IC elements on different IC layers, vertically stacked. An example might be a V2 chain atop a M1 snake and comb (s&c). The V2 chain utilizes the M2, M3, and V2 layers, whereas the M1 s&c utilizes only the M1 layer. The elements to be used in the V2 chain experiment can be disposed directly above the elements to be used in the M1 s&c experiment; this would be an example of a stack of two DUT's.

The inventive configuration merges a plurality of SF's into one full flow mask set. Due to the fact that all elements are passive, there is no constraint that any previous or subsequent layers are necessarily essential to an experiment on a given layer, therefore the inventive CV supports Short Loop Modes or Short Flows which can start or stop anywhere in the process sequence. Layers may additionally be skipped during production. This compares with existing CV's, which may support stopping early, but do not support starting later in the process sequence, mainly because of the usage of active devices to address test structures. A selection of this type of existing CV's is described in: Christopher Hess, *Universal Characterization Vehicle (UCV)& Fast Testing Methods, Tutorial B2 of the International Symposium on Quality Electronic Design (ISQED)*, San Jose, USA, 2003, and in Christopher Hess, *Efficient Usage of Test Structures, Tutorial of International Conference on Microelectronic Test Structures (ICMTS)*, Tokyo, 2007.

For the inventive configuration, a single full flow mask set and associated reticles are all that is required. This may evidence substantial savings compared with several dedicated SF mask sets and reticles. As will be described hereinafter, the inventive CV enables the use of many inline testing points.

Stacking of exemplary DUT's according to the present invention is shown in FIGS. 3a-3e.

Figure 3A:
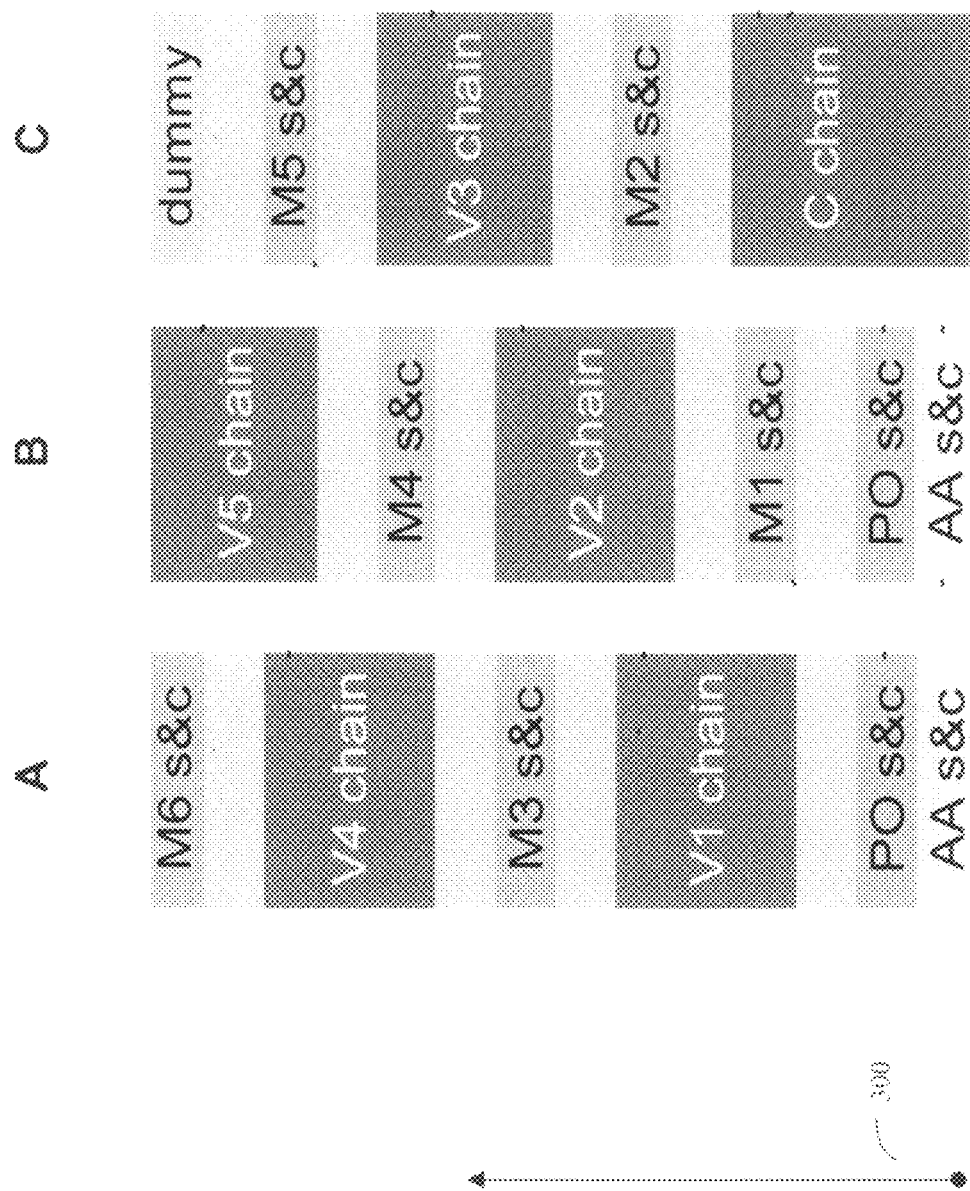
FIG. 3a illustrates a cross sectional view of several possible stacking configurations.

FIG. 3a illustrates a cross sectional view of several possible stacking configurations, which are denoted as type A, type B, and type C. The z-axis 300 denotes the vertically stacked layers.

In general, every layer on the IC can be used for three different types of test structures: 1) a DUT using just the one routing layer; (In this context, "routing layer" refers to a layer on which routing lines can be drawn; for example, contact and vias are not considered routing layers in this context.) 2) a DUT using the routing layer as well as further routing layer or layers below; and 3) A DUT using the routing layer as well as further routing layer or layers above. There are thus three basic ways to stack DUT's: 1) stacking configuration A, starting at single routing layer structure AA and/or Poly, followed by dual routing layer structure V1 (which utilizes the M1 and M2 routing layers), single routing layer structure M3, dual routing layer structure V4 (which utilizes the M4 and M5 routing layers), further repeated if there are more metal layers; 2) stacking configuration B, starting at single routing layer structure AA and/or poly, followed by a second single routing layer structure M1, dual routing layer structure V2 (utilizing the M2 and M3 routing layers), single routing layer structure M4, further repeated if there are more metal layers; and 3) stacking configuration C, starting with CNT (utilizing AA and/or poly, contact, and M1 layers), followed by single routing layer structure M2, dual routing layer structure V3 (utilizing M3 and M4 routing layers), single routing layer structure M5, further repeated if there are more metal layers.

Figure 3B:
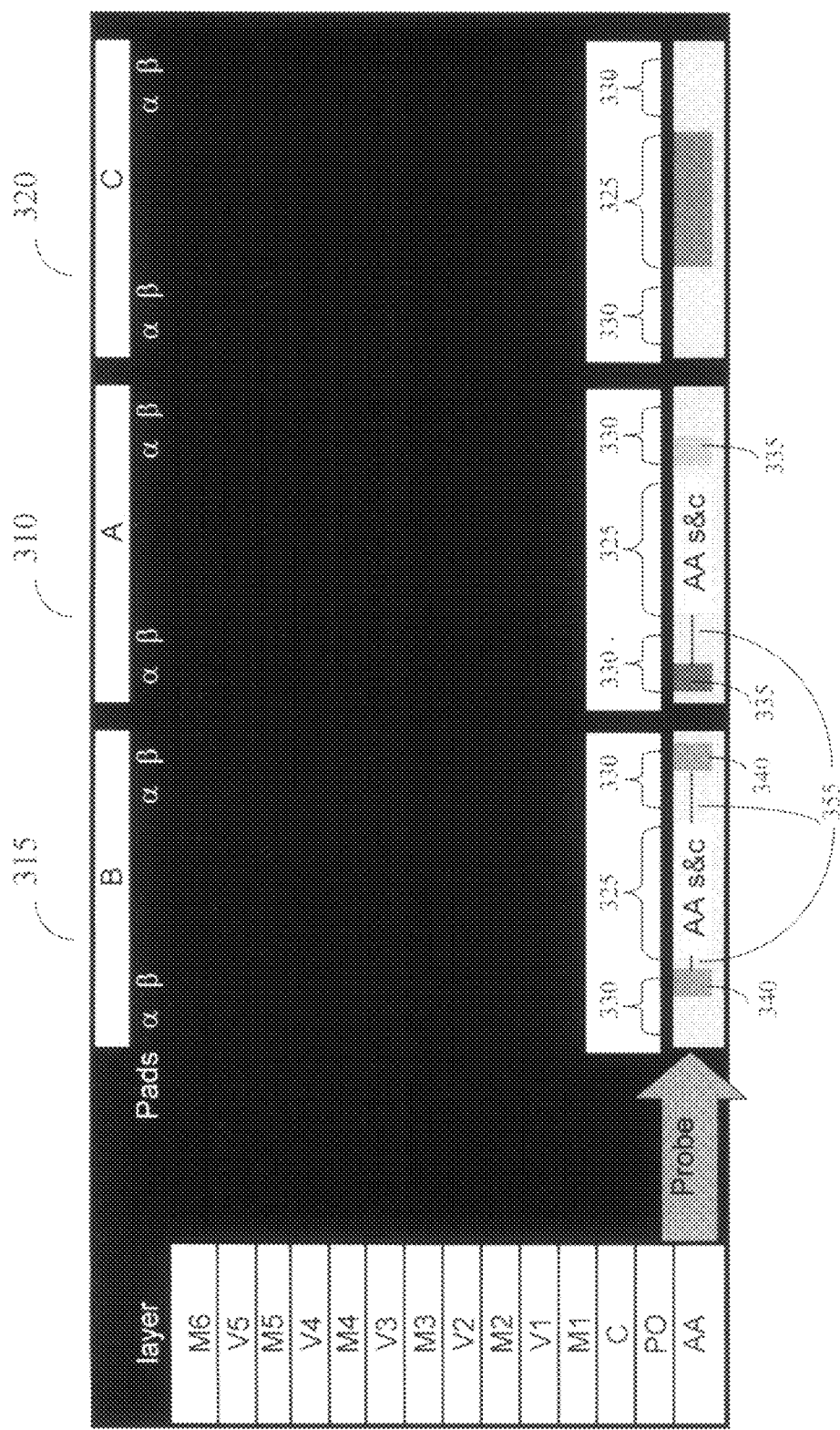
FIG. 3b shows a cross-sectional view of an exemplary partially constructed stacked CV, at the Active Area (AA) layer.

FIG. 3b shows a cross-sectional view of an exemplary partially constructed stacked CV, at the Active Area (AA) layer. The exemplary CV utilizes three stacks, in this case one of each type A (310), B (315), and C (320), on different portions of the chip. Each stack is comprised of a test structure region 325, flanked by pad regions 330. Each pad region contains interleaved pads of types alpha (335) and Beta (340) as described earlier. A first touchdown of the probe card contacts alpha pads only, a second touchdown contacts beta pads only. The alpha and beta pads may be divided into sub-groups which are used for certain test structures. Connections 355 from the pads to the test structures are shown. Probing may occur at the AA level as shown. In order to reduce the pad density per layer at the FEOL, the Poly and AA structures are routed to different pad touchdowns; i.e., if the Poly structures are routed to alpha pads, the AA structures are routed to beta pads, or vice versa.

Figure 3C:
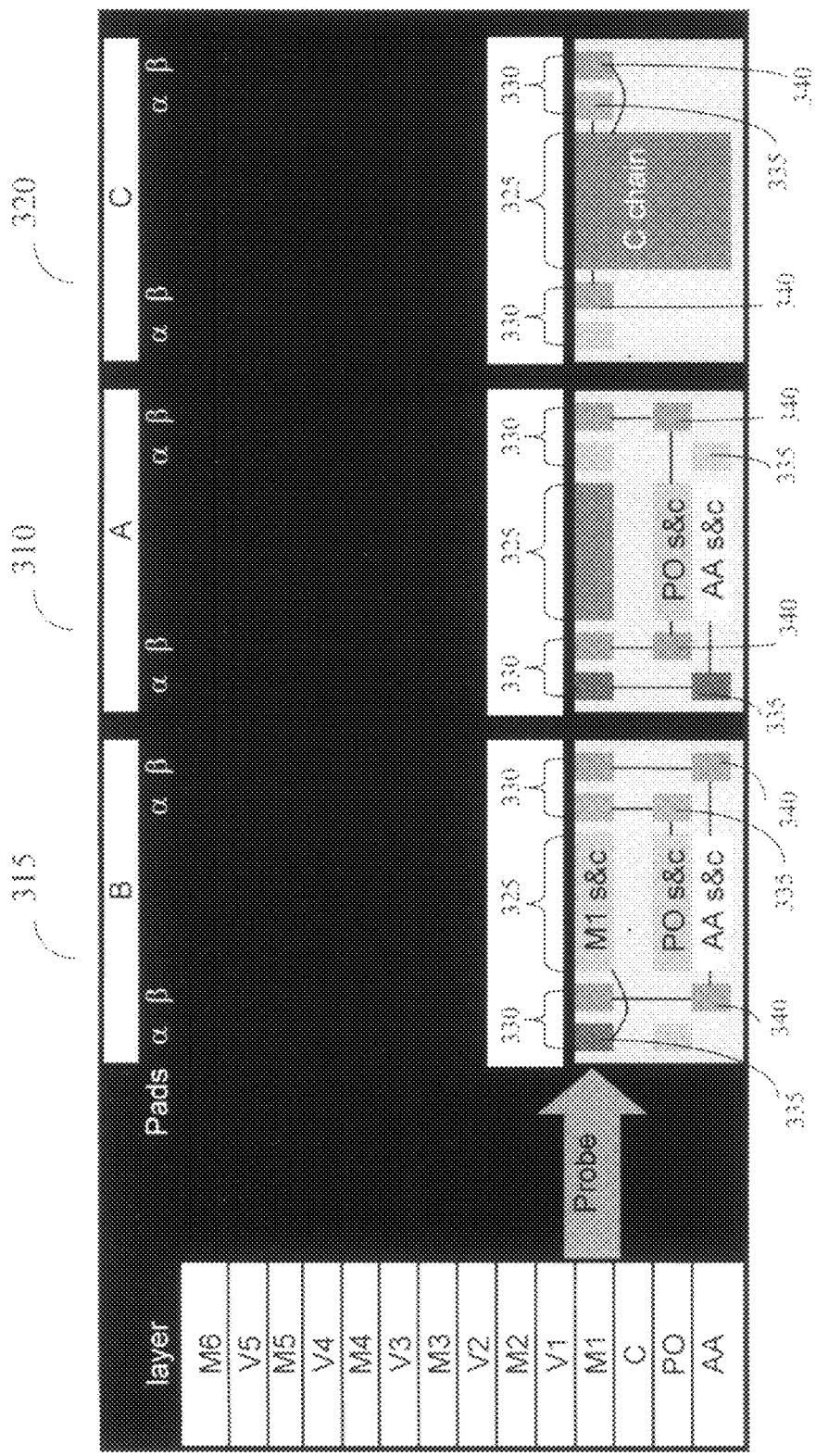
FIG. 3c shows a cross-sectional view of the stacked CV of FIG. 3b, at the M1 layer.
Figure 3D:
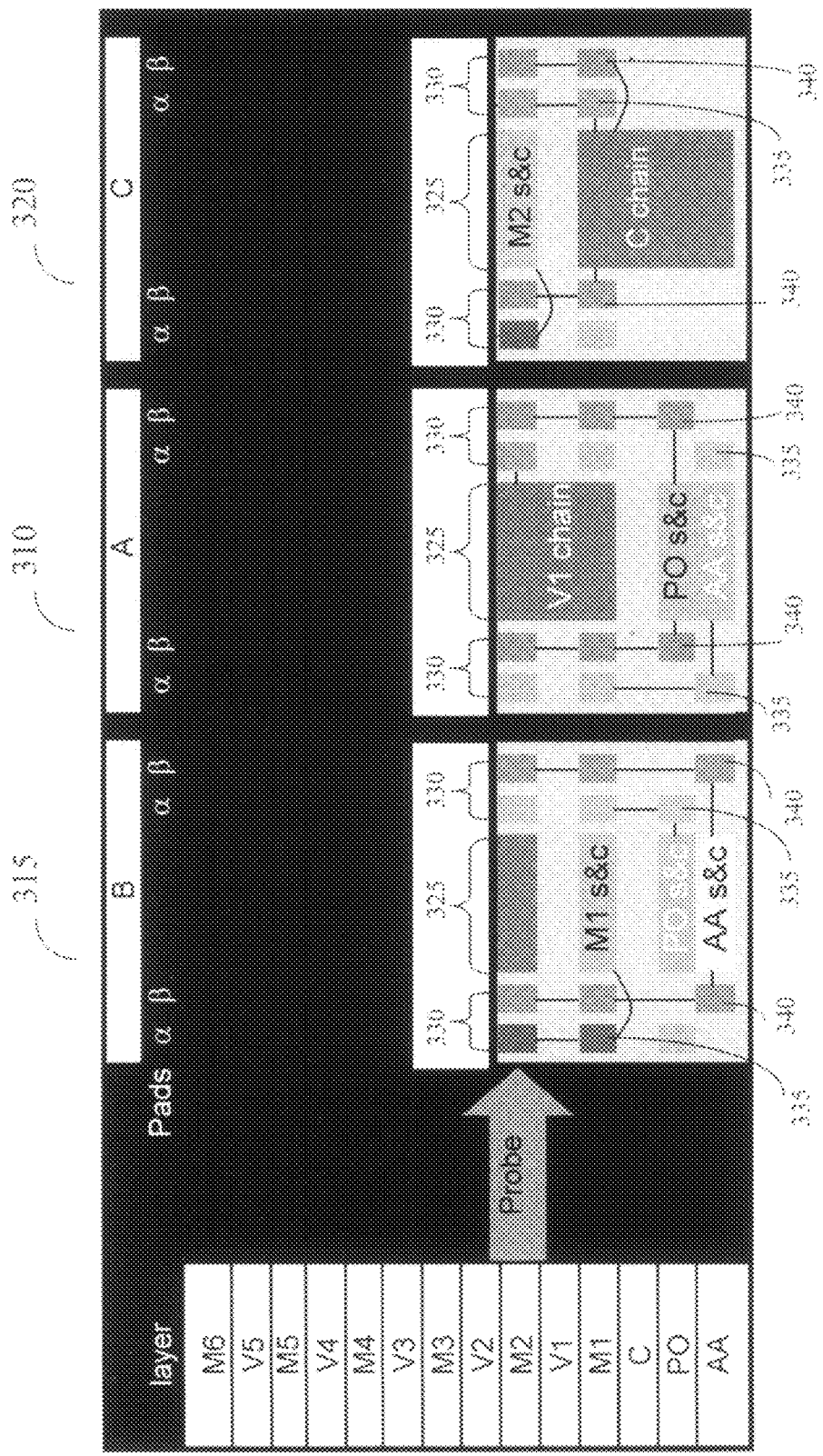
FIG. 3d shows a cross sectional view of the stacked CV of FIG. 3b, at the M2 layer.

FIG. 3c shows a cross-sectional view of the stacked CV of FIG. 3b, at the M1 layer. Note that Poly layer PO is between AA and M1. Probing may occur at the M1 layer as shown. Alpha pads 335 probe M1 s&c structures and PO s&c structures on stack 315, AA s&c structures on stack 310, and C chain structures on stack 320; beta pads 340 probe AA s&c structures on stack 315, PO s&c structures on stack 310, and C chain structures on stack 320. Also note that the beta pads connected to the AA s&c structures on stack 315 are also connected vertically to the same placement beta pads on the M1 layer. Similar connections are made between the alpha pads on stack 310. In general, the vertical pad connections are made so that the tester can access all the test structures at the current layer plus the test structures that have been manufactured at one or two lower routing layers. This is always true for BEOL layers. For FEOL layers, the structures can always be accessed at the current routing layer plus at least one routing layer down. Only a subset of FEOL test structures can be accessed more than one routing layer above. This is due to the fact that typically, more experiments and therefore more DUT's are needed for FEOL than for BEOL. For example, not all AA and PO structures can be accessed at M2, as illustrated in FIG. 3d, which shows a cross sectional view of the stacked CV of FIG. 3b, at the M2 layer. Since the main purpose of the inventive CV is to allow running it in short loops, it has been determined that the ability to access three routing layers is sufficient for the inline testing being used here; it is not necessary to access all routing layers when the test structures are completed, as is typically done for logic CV's, which typically have each pad set connected through all the layers so as to allow access to all levels even at the end. The limiting of access to three routing layers as in the inventive CV enables more test structures, and is one aspect of the inventive structure which permits the combining of several SF's into one CV.

Figure 3E:
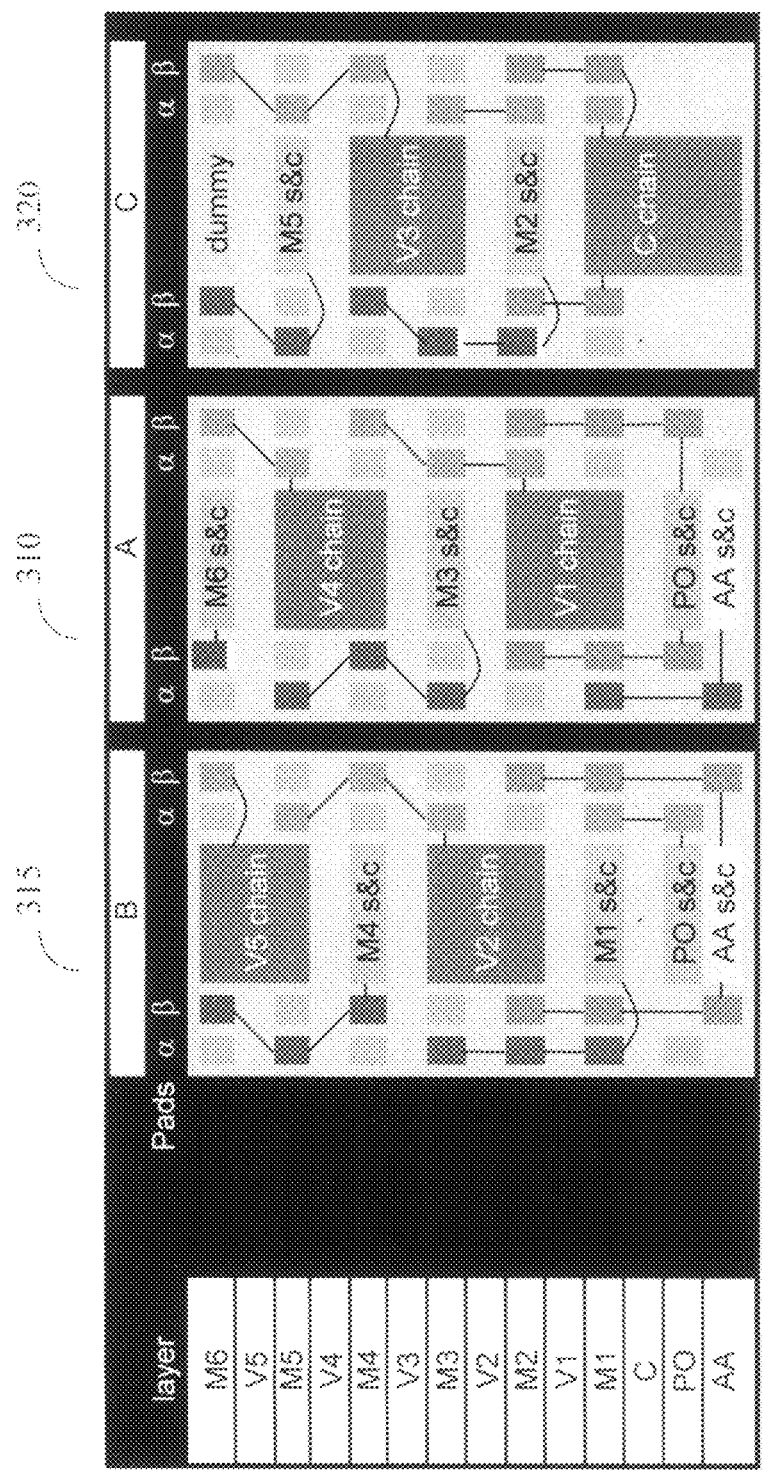
FIG. 3e shows a completed exemplary CV from a side view.

The stacked CV is built up layer by layer similarly to the already shown AA, PO, and M1 layers. FIG. 3e shows a completed exemplary CV from a side view. The completed CV has layers up to M6. Probing is enabled at layers AA, PO, M1, M2, M3, M4, M5, and M6. All tests on a given layer are routed to pads on that layer. Note that routing layers can be a part of many types of tests. For example, the M3 layer can be used as part of: 1) M3 test; 2) V2 test; and 3) V3 test. Note that region 315 contains a stack of 6 experiments; AA s&c; PO s&c; M1 s&c; V2 chain; M4 s&c, and V5 chain. Region 310 also contains a stack of 6 experiments: AA s&c; PO s&c; V1 chain; M3 s&c; V4 chain; and M6 s& c. Region 320 contains a stack of 5 experiments; C chain; M2 s&c; V3 chain; M5 s&c; and dummy layer at M6 not connected to any pads.

FIG. 3e illustrates other aspects of the inventive CV:
1) Short flow may start and/or stop at any interconnect layer or other IC layer;
2) There is inline testability at every layer, since there are pads in every routing layer, which provide access to those test structures that have been manufactured in the current layer as well as 2-3 layers below.
3) To prevent short circuits between layers from probe needle pressure, every pair of pads placed directly on top each other in adjacent layers has one floating pad interposed therebetween unless both pads are connected to the same test structure. For interconnect layers M3 and above, connected pads are staggered between groups alpha and beta for adjacent layers, thus providing additional protection against short circuits. It is generally true of the inventive CV, however, that there are pads directly atop one another in non-adjacent layers which are connected to different test structures.
4) There are a minimum of 2 probing layers per DUT (as for FEOL test structures), and BEOL test structures have 3 probing layers.
5) The increase in available pads without additional chip area consumption is seen due to three factors: a) app. 50% reduction of footprint along the x-axis due to the smaller pads; b) double the pad count by interleaving the pads in y; and c) the increase due to the stacking in z; i.e., the number of available pads is tripled by the ability to assign pads at the same x- and y-position to different test structures according to their routing and probing layer. These three factors together account for at least a tenfold increase in available pads for the inventive CV compared to conventional test chips.

Figure 4:
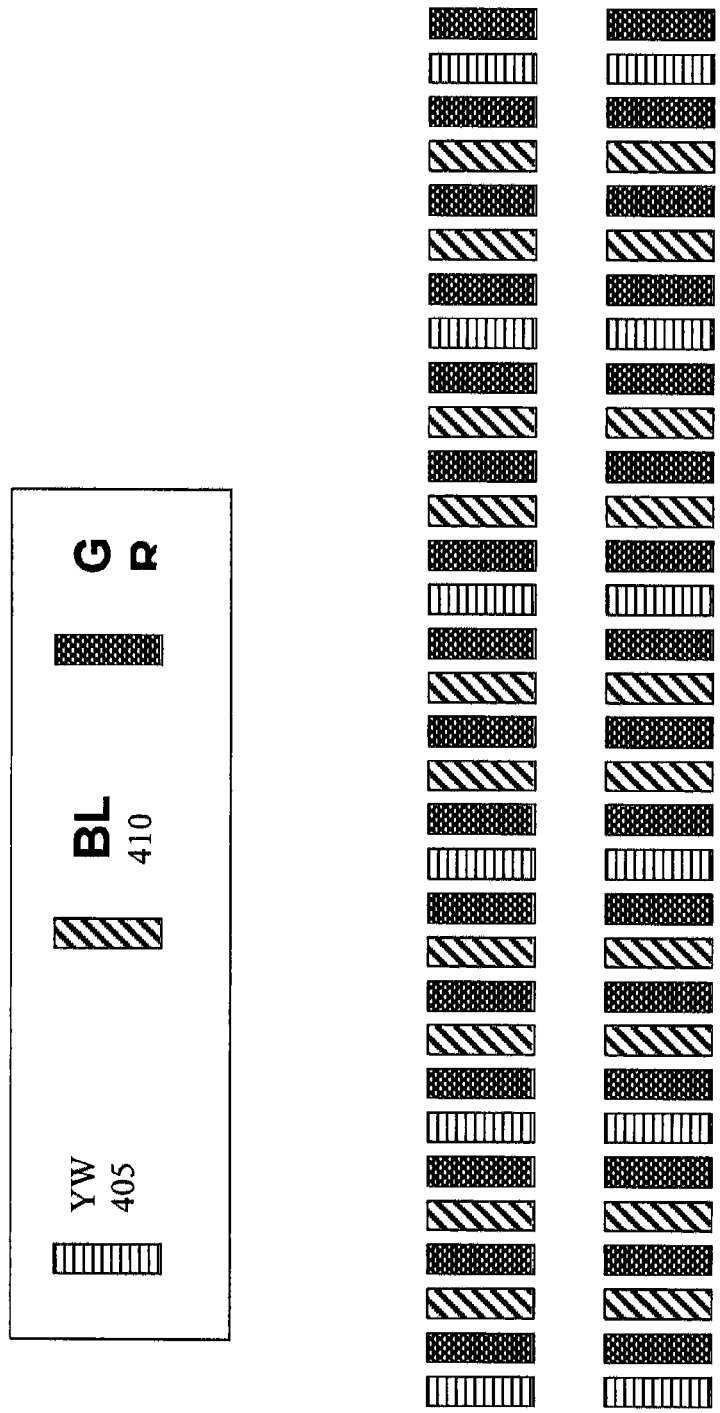
FIG. 4 illustrates an exemplary distribution of DUT's among pads.

FIG. 4 illustrates an exemplary distribution of DUT's among pads. The smallest design unit for this example is 2 interleaved 2×16 pad groups; i.e., 32 pads are available for testing on interleave alpha; 32 pads are available for testing on interleave beta. There is no testing between alpha and beta pads; only testing within alpha pads or within beta pads is possible. The 64 total pads are grouped into sub-groups; in this exemplary case, 12 alpha pads are called YW ("yellow") pads 405; 20 alpha pads are called BL ("blue") pads 410; all 32 beta pads are called GR ("green") pads 415. Referring back to FIG. 3a, in this example, for stack type A, 32 GR pads are exclusively used for AA and PO DUT's; 12 YW pad are used for single layer M3 and M6 DUT's; and 20 BL pads are used for dual layer V1 and V4 DUT's. For stack type B, 32 GR pads are exclusively used for AA and PO DUT's; 12 YW pads are used for single layer M1 and M4 DUT's; 20 BL pads are used for dual layer V2 and V5 DUT's. For stack type C, 32 GR pads are exclusively used for CNT DUT's; 12 YW pads are used for single layer M2 and M5 DUT's; and 20 BL pads are used for dual layer V3 DUT's.

An aspect of this present invention is its enabling of re-use of wafers after testing. This is in part a result of the combining of the multiple SF's into a single reticle set, which is built to be compatible between experiments. It is also due to the increase in pads, which allows more experiments on many layers. Prior art CV's did not allow reuse of wafers, partly due to running out of pads, and partly due to alignment problems when multiple reticle sets were used.

The process flow for the re-use of wafers is as follows:
a) starting fabrication of the CV on a first set of wafers at the start of a first short flow;
b) stopping fabrication of the CV at the end of the first short flow, a first set of DUT's corresponding to the first short flow being thereby fabricated on the CV;
c) testing the first set of DUT's;
d) starting fabrication of the CV on the first set of wafers at the start of a second short flow;

e) stopping fabrication of the CV at the end of the second short flow, a second set of DUT's corresponding to the second short flow being thereby fabricated on the CV; and f) testing the second set of DUT's.

Steps d)-f) can be repeated for additional short flow's.

Figure 5A:
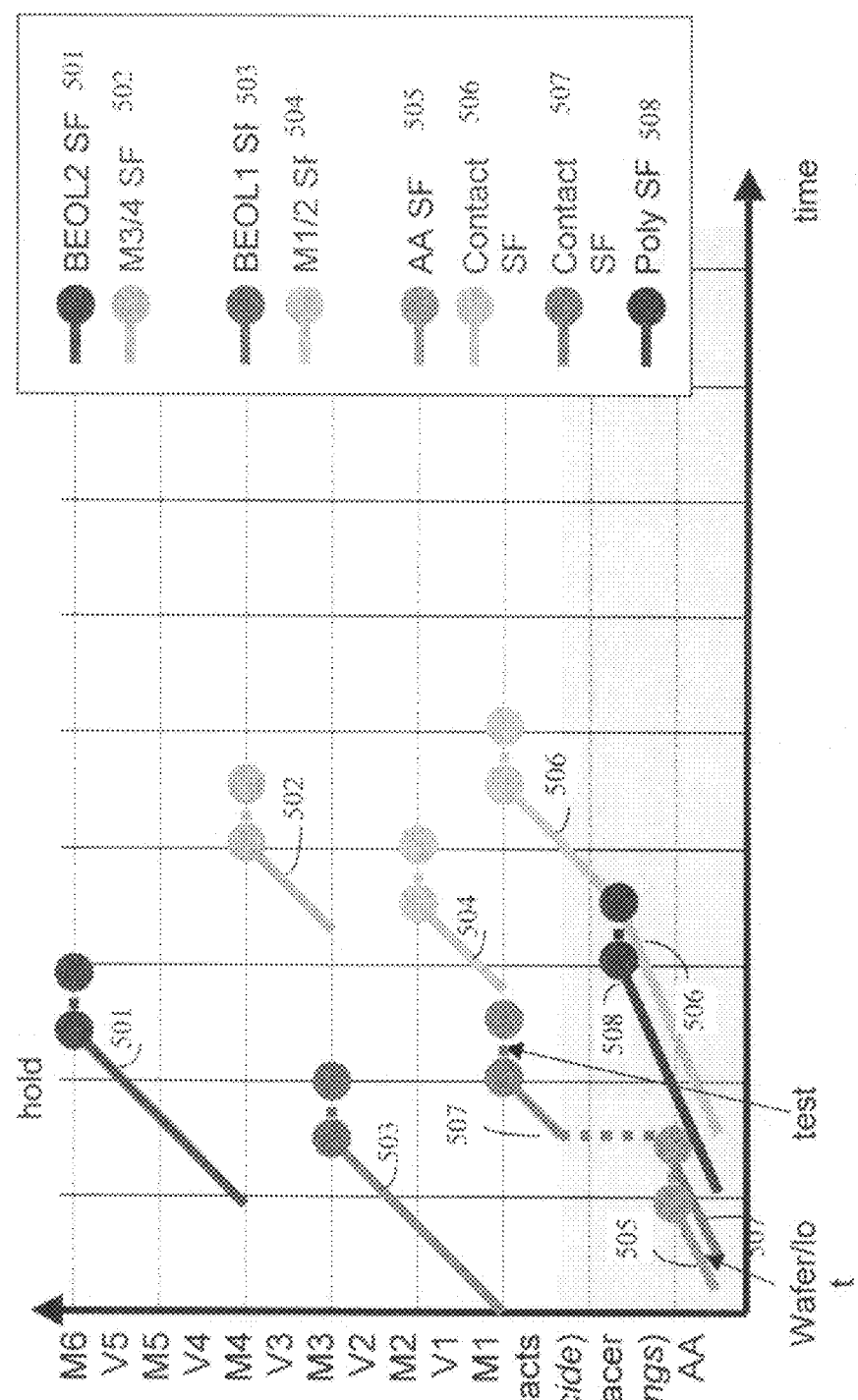
FIG. 5a illustrates lot production as a function of time, for no re-use of wafers.
Figure 5B:
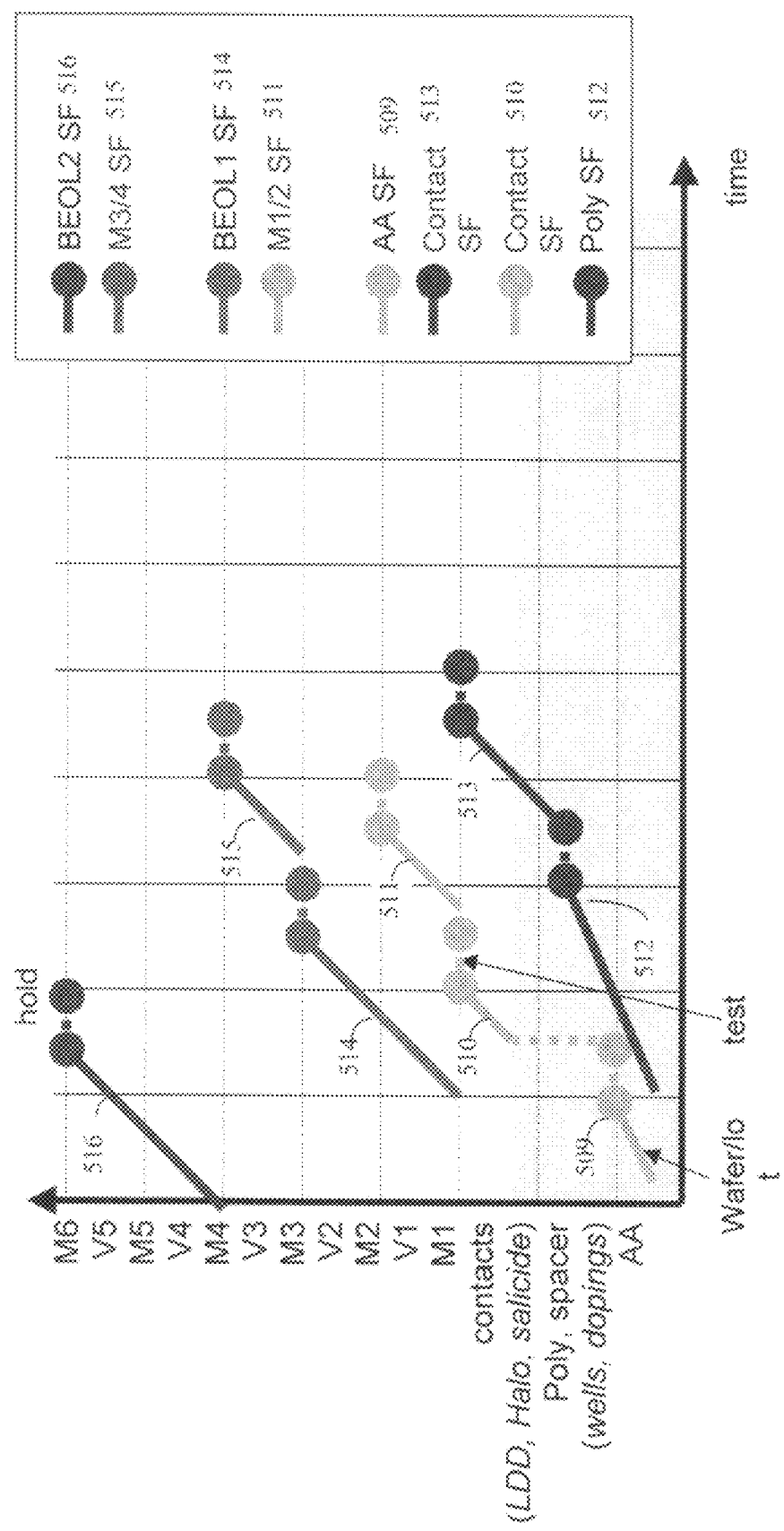
FIG. 5b illustrates lot production as a function of time, for re-use of wafers.

The re-use of wafers is important to decrease fab crowding by engineering lots, particularly at the front end. This is illustrated in FIG. 5a, which shows lot production layer by layer, as a function of time, for no re-use of wafers, and in FIG. 5b, for re-use of wafers. For no re-use, lots 501-508 are required to perform the listed tests. Note that four engineering lots are running simultaneously at one point in the front end. Note also that eight lots of wafers are required. In FIG. 5b, AA SF lot 509 is tested, then the wafers re-used for contact SF 510 and again for M1/2 SF 511. Poly SF 512 wafers are re-used for contact SF 513. BEOL 1 SF 514 wafers are re-used for M3/4 SF 515. Note that in this case, first of all, only two front end lots are running, thereby greatly reducing fab crowding. Secondly, only four lots of wafers are required, yielding a large cost saving. Fewer lots in the fab line reduces the delay due the overloading of certain manufacturing tools or test stations.

Figure 6:
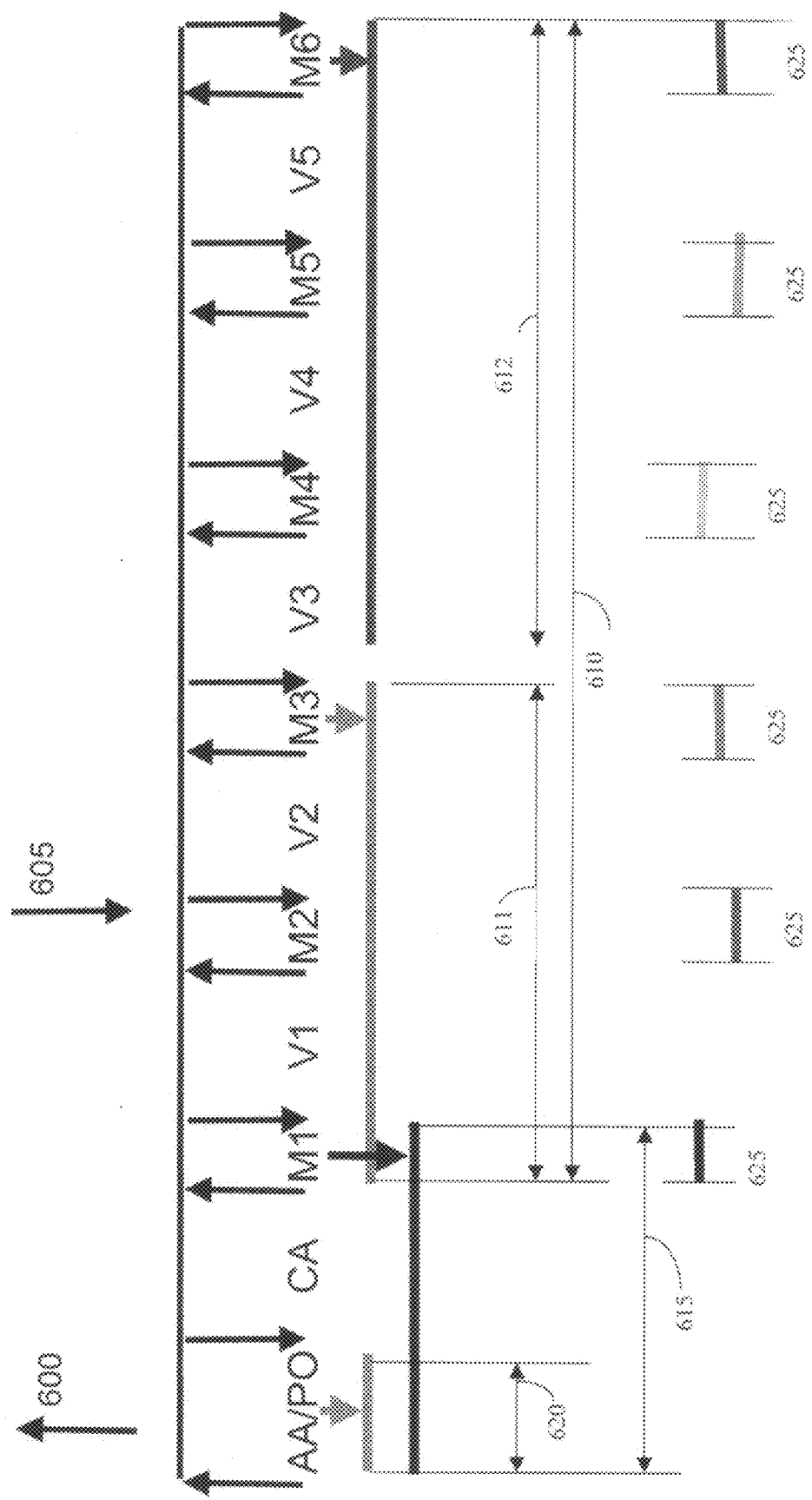
FIG. 6 illustrates exemplary SF stackable CV run modes.

FIG. 6 illustrates exemplary SF stackable CV run modes. Upward arrows 600 represent possible SF starts, downward arrows 605 represent possible SF ends. Full BEOL flow 610 can include inline testing at M3, and end of line testing at M6, or it can be divided into BEOL1 (which can be inline tested at M1 and M2) and BEOL2. FEOL SF 615 can include active area AA to M1, or ultra-SF PO (Poly) 620 can be tested post-silicide, and can then be re-used for BEOL SF. Ultra-SF metal flows 625 can be run at each metal level (with substrate re-use), and focusing on single layer defectivity with topography. In this case, the metal pads are not stacked directly above one another, allowing testing of adjacent layers without pad shorts. Interlayer dielectric layers are needed, but via processing can be skipped. In general, the inventive CV includes at least one FEOL short flow and at least one BEOL short flow.

Figure 7:
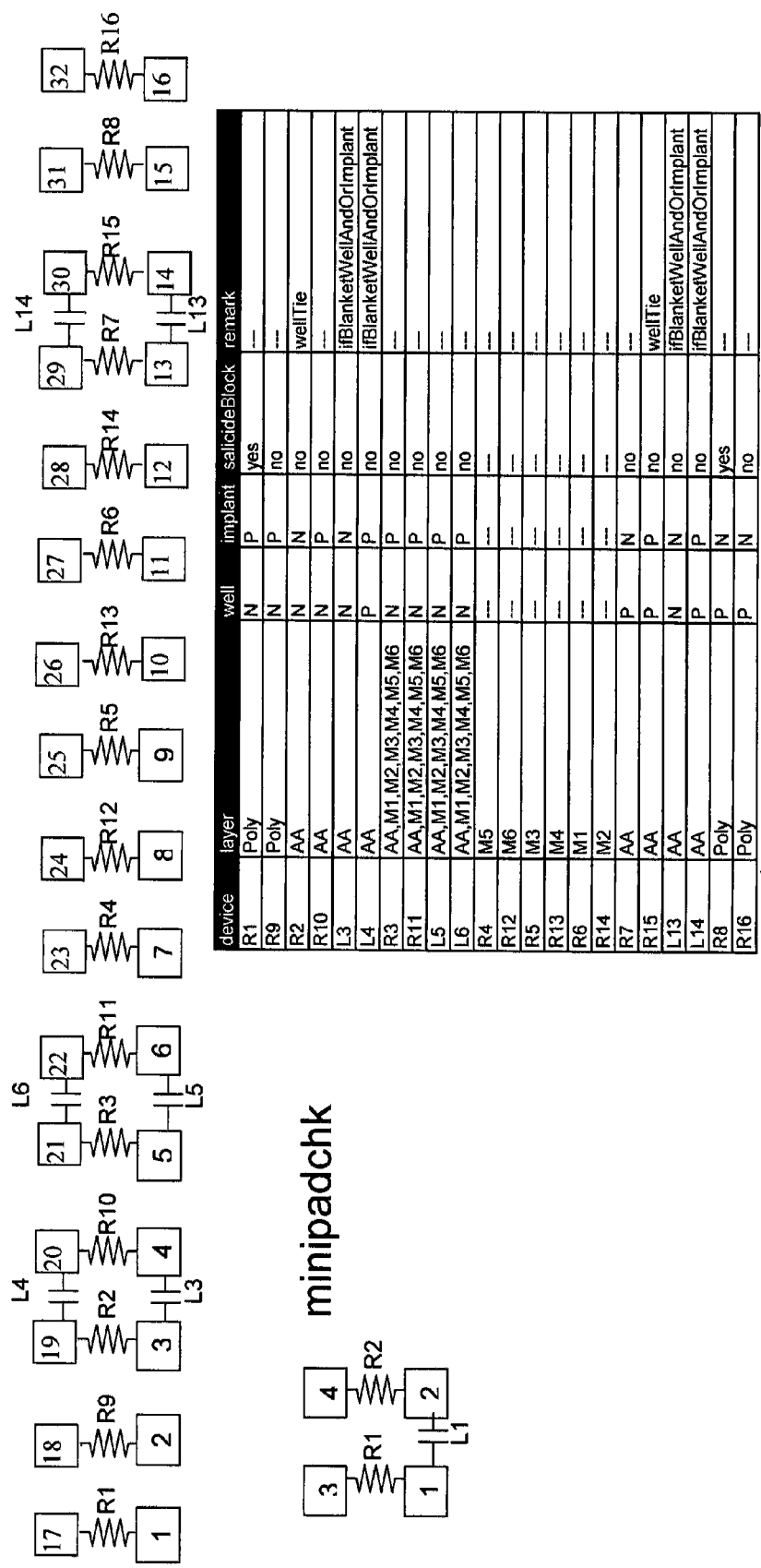
FIG. 7 illustrates an exemplary ID padgroup.

An aspect of the present invention is the inclusion of an ID padgroup to drive conditional testing. One set of pads is connected to structures which permit history extraction of that wafer. This so-called e-ID padgroup tests a series of resistors which are layer-dependent, and whose presence or absence indicates the fabrication history of the CV. FIG. 7 illustrates an exemplary ID padgroup, and includes a table indicating which layers are associated with the different resistors and associated inductances. This allows selecting the correct test program, only focusing on manufactured layers so as to reduce test time.

The present invention provides a full-flow mask set with a plurality of stacked experiments, designed to merge a plurality of often used CV's into a single mask set; i.e., Poly SF, Contact SF, BEOL SF, and BEQL2 SF. This provides a large cost savings compared to separate reticle and mask sets for each SF. Only passive test structures are included, which enables starting or stopping the process flow at any layer, for targeted defectivity reduction or greatly flexible process run modes. This can include a large number of possible SF's and ultra-SF's. Therefore, the fastest possible cycle time can be achieved. All structures are testable at any layer starting at post-silicide AA/PO, FEOL test structures are testable up to M2, and BEOL test structures are testable for three layers. Due to an inventive interleaved padframe using smaller pads, a much larger number of pads may be used, allowing many more experiments, and the ratio of test structure area to pad area is greatly increased. The inventive CV allows for inline testing and wafer re-use, which yields substantial savings and reduces fab crowding. Test time is reduced to approximately 1 hour per layer when using a tester providing parallel testing of all pads during one touch down.

It is not expected that this invention is restricted to the exact embodiments disclosed herein. Those skilled in the art will recognize that changes and modifications may be made without departing from the inventive concept. By way of example, a hybrid scheme wherein the addition of active addressing logic at the top BEOL layer only would provide access to all test structures is thought to be possible. Another possible modification could occur if probe cards could be built which could utilize a more aggressive pitch for probing pads. In this case, the inventive CV might be constructed without interleaved pads for separate touch downs, in order to further reduce test time.

The present invention can be generalized to IC structures having vertically stacked IC layers including routing layers, IC features, the routing layers having pads thereon for performing tests on sets of features fabricated on the IC structure, each said pad having a lateral position, such that at least a subset of the pads on different routing layers having the same lateral position are connected to different features. The routing layers would need to be at a level at least as high as the features being tested, so that the features are functional. The present invention can be further generalized to using subsets of interleaved pads to sequentially contact, using the same probe card, subsets of features on IC structures having vertically stacked IC layers including routing layers, IC features, the routing layers having pads thereon for performing tests on sets of features fabricated on the IC structure. The subsets of interleaved pads can be completely distinct, i.e., sharing no pads, or they can share some pads, for example up to 50% of the pads. The number of sequential touch downs with the probe card can be two or more.

The scope of the invention should be construed in view of the claims.

With this in mind, we claim:

1. An in-line testable characterization vehicle (CV) comprising at least three vertically stacked regions of a semiconductor wafer including at least one routing layer, said CV comprising at least:

a first vertically stacked region that includes at least:
six alpha-positioned first-region probing pads, said alpha-positioned first-region probing pads vertically disposed at the top of said first vertically stacked region and horizontally positioned so that they contact respective probe leads of a probe card that is horizontally positioned in a respective alpha position;

six beta-positioned first-region probing pads, said beta-positioned first-region probing pads vertically disposed at the top of said first vertically stacked region and horizontally positioned so that they contact respective probe leads of a probe card that is horizontally positioned in a respective beta position;

first, second, and third first-region passive test structures, some of said first-region passive test structures reachable via said alpha-positioned first-region probing pads and other(s) of said first-region passive test structures reachable via said beta-positioned first-region probing pads;

a second vertically stacked region, positioned directly above the first vertically stacked region, wherein the second vertically stacked region includes at least:
six alpha-positioned second-region probing pads, said alpha-positioned second-region probing pads vertically disposed at the top of said second vertically stacked region and horizontally positioned so that they contact respective probe leads of a probe card that is horizontally positioned in the alpha position;

six beta-positioned second-region probing pads, said beta-positioned second-region probing pads vertically disposed at the top of said second vertically stacked region and horizontally positioned so that they contact respective probe leads of a probe card that is horizontally positioned in the beta position;

first, second, and third second-region passive test structures, some of said second-region passive test structures reachable via said alpha-positioned second-region probing pads and other(s) of said second-region passive test structures reachable via said beta-positioned second-region probing pads; and, a third vertically stacked region, positioned directly above the second vertically stacked region, wherein the third vertically stacked region includes at least:

six alpha-positioned third-region probing pads, said alpha-positioned third-region probing pads vertically disposed at the top of said third vertically stacked region and horizontally positioned so that they contact respective probe leads of a probe card that is horizontally positioned in the alpha position;

six beta-positioned third-region probing pads, said beta-positioned third-region probing pads vertically disposed at the top of said third vertically stacked region and horizontally positioned so that they contact respective probe leads of a probe card that is horizontally positioned in the beta position;

first, second, and third third-region passive test structures, some of said third-region passive test structures reachable via said alpha-positioned third-region probing pads and other(s) of said third-region passive test structures reachable via said beta-positioned third-region probing pads.

2. The CV of claim 1, further comprising:
connections between at least some of the alpha-positioned, first-region probing pads and the alpha-positioned, second-region probing pads;
connections between at least some of the beta-positioned, first-region probing pads and the beta-positioned, second-region probing pads.

3. The CV of claim 2, further comprising:
connections between at least some of the alpha-positioned, second-region probing pads and the alpha-positioned, third-region probing pads;
connections between at least some of the beta-positioned, second-region probing pads and the beta-positioned, third-region probing pads.

4. An in-line testable characterization vehicle (CV) comprising at least three vertically stacked regions of a semiconductor wafer, said CV comprising at least:
a first vertically stacked region that includes at least:
thirty-two alpha-positioned first-region probing pads, said alpha-positioned first-region probing pads vertically disposed at the top of said first vertically stacked region and horizontally positioned so that they contact respective probe leads of a probe card that is horizontally positioned in a respective alpha position;
thirty-two beta-positioned first-region probing pads, said beta-positioned first-region probing pads vertically disposed at the top of said first vertically stacked region and horizontally positioned so that they contact respective probe leads of a probe card that is horizontally positioned in a respective beta position;
a plurality of first-region passive test structures, some of said first-region passive test structures reachable via said alpha-positioned first-region probing pads and other(s) of said first-region passive test structures reachable via said beta-positioned first-region probing pads;

a second vertically stacked region, positioned directly above the first vertically stacked region, wherein the second vertically stacked region includes at least:
thirty-two alpha-positioned second-region probing pads, said alpha-positioned second-region probing pads vertically disposed at the top of said second vertically stacked region and horizontally positioned so that they contact respective probe leads of a probe card that is horizontally positioned in the alpha position;
thirty-two beta-positioned second-region probing pads, said beta-positioned second-region probing pads vertically disposed at the top of said second vertically stacked region and horizontally positioned so that they contact respective probe leads of a probe card that is horizontally positioned in the beta position;
a plurality of second-region passive test structures, some of said second-region passive test structures reachable via said alpha-positioned second-region probing pads and other(s) of said second-region passive test structures reachable via said beta-positioned second-region probing pads; and, a third vertically stacked region, positioned directly above the second vertically stacked region, wherein the third vertically stacked region includes at least:
thirty-two alpha-positioned third-region probing pads, said alpha-positioned third-region probing pads vertically disposed at the top of said third vertically stacked region and horizontally positioned so that they contact respective probe leads of a probe card that is horizontally positioned in the alpha position;
thirty-two beta-positioned third-region probing pads, said beta-positioned third-region probing pads vertically disposed at the top of said third vertically stacked region and horizontally positioned so that they contact respective probe leads of a probe card that is horizontally positioned in the beta position;
a plurality of third-region passive test structures, some of said third-region passive test structures reachable via said alpha-positioned third-region probing pads and other(s) of said third-region passive test structures reachable via said beta-positioned third-region probing pads.

5. The CV of claim 4, further comprising:
connections between at least some of the alpha-positioned, first-region probing pads and the alpha-positioned, second-region probing pads;
connections between at least some of the beta-positioned, first-region probing pads and the beta-positioned, second-region probing pads.

6. The CV of claim 5, further comprising:
connections between at least some of the alpha-positioned, second-region probing pads and the alpha-positioned, third-region probing pads;
connections between at least some of the beta-positioned, second-region probing pads and the beta-positioned, third-region probing pads.

7. An in-line testable characterization vehicle (CV) comprising at least three vertically stacked regions of a semiconductor wafer, said CV comprising at least:
a first vertically stacked region that includes at least:

thirty-two alpha-positioned first-region probing pads, said alpha-positioned first-region probing pads vertically disposed at the top of said first vertically stacked region and horizontally positioned so that they contact respective probe leads of a probe card that is horizontally positioned in a respective alpha position;

thirty-two beta-positioned first-region probing pads, said beta-positioned first-region probing pads vertically disposed at the top of said first vertically stacked region and horizontally positioned so that they contact respective probe leads of a probe card that is horizontally positioned in a respective beta position;

a plurality of first-region test structures, some of said first-region test structures reachable via said alpha-positioned first-region probing pads and other(s) of said first-region test structures reachable via said beta-positioned first-region probing pads;

a second vertically stacked region, positioned directly above the first vertically stacked region, wherein the second vertically stacked region includes at least:

thirty-two alpha-positioned second-region probing pads, said alpha-positioned second-region probing pads vertically disposed at the top of said second vertically stacked region and horizontally positioned so that they contact respective probe leads of a probe card that is horizontally positioned in the alpha position;

thirty-two beta-positioned second-region probing pads, said beta-positioned second-region probing pads vertically disposed at the top of said second vertically stacked region and horizontally positioned so that they contact respective probe leads of a probe card that is horizontally positioned in the beta position;

a plurality of second-region test structures, some of said second-region test structures reachable via said alpha-positioned second-region probing pads and other(s) of said second-region test structures reachable via said beta-positioned second-region probing pads; and, a third vertically stacked region, positioned directly above the second vertically stacked region, wherein the third vertically stacked region includes at least:

thirty-two alpha-positioned third-region probing pads, said alpha-positioned third-region probing pads vertically disposed at the top of said third vertically stacked region and horizontally positioned so that they contact respective probe leads of a probe card that is horizontally positioned in the alpha position;

thirty-two beta-positioned third-region probing pads, said beta-positioned third-region probing pads vertically disposed at the top of said third vertically stacked region and horizontally positioned so that they contact respective probe leads of a probe card that is horizontally positioned in the beta position;

a plurality of third-region test structures, some of said third-region test structures reachable via said alpha-positioned third-region probing pads and other(s) of said third-region test structures reachable via said beta-positioned third-region probing pads.

8. The CV of claim 7, further comprising:

connections between at least some of the alpha-positioned, first-region probing pads and the alpha-positioned, second-region probing pads;

connections between at least some of the beta-positioned, first-region probing pads and the beta-positioned, second-region probing pads.

9. The CV of claim 8, further comprising:

connections between at least some of the alpha-positioned, second-region probing pads and the alpha-positioned, third-region probing pads;

connections between at least some of the beta-positioned, second-region probing pads and the beta-positioned, third-region probing pads.

\* \* \* \* \*